United States Patent
Milkovic

[11] 3,961,257
[45] June 1, 1976

[54] SINGLE PHASE 3-WIRE ELECTRONIC ELECTRICAL ENERGY METER

[75] Inventor: Miran Milkovic, Scotia, N.Y.

[73] Assignee: General Electric Company, Schenectady, N.Y.

[22] Filed: Sept. 13, 1974

[21] Appl. No.: 505,798

[52] U.S. Cl. .............................. 324/142; 328/158; 328/160
[51] Int. Cl.² ..................... G01R 7/00; G01R 11/32
[58] Field of Search ............. 324/142; 328/158, 160

[56] References Cited
UNITED STATES PATENTS

| | | | |
|---|---|---|---|
| 3,084,863 | 4/1963 | Du Vall | 324/142 X |
| 3,226,641 | 12/1965 | Miller | 324/142 |
| 3,470,471 | 9/1969 | Moore | 324/142 |
| 3,517,311 | 6/1970 | Wasielewski et al. | 324/142 |

OTHER PUBLICATIONS

"An Electronic Wattmeter for Nonsinusoidal Low Power Factor Power Measurement" by Hamburg et al., IEEE Transaction on Magnetics, Sept. 1971, vol. Mag. 7, No. 3, pp. 438–442.
"A Wide-Band Wattmeter for the Measurement and Analysis of Power Dissipation in Semiconductor Switching Device" by Schwarz et al., IEE Transaction on Electronic Devices, vol. ed. 17, No. 9, Sept. 1970.

Primary Examiner—Saxfield Chatmon, Jr.
Attorney, Agent, or Firm—Vale P. Myles

[57] ABSTRACT

Metering kWh in a single phase, 3-wire, $F_L$ Hertz a.c. electrical system is accomplished by detecting the current flow in two lines of the three-wire system by means of a current transformer having two primary windings and a single secondary winding. The voltage in the system is detected by means of a potential transformer having the primary windings thereof connected across the load impedances and having the secondary thereof connected to a pulse width amplitude modulated multiplier. The multiplier derives a signal which is proportional to the current in the system and the detected voltage across the load impedances thereof. The output of the multiplier is converted to a d.c. voltage which is proportional to the total average power consumed by each of the load impedances with the d.c. average power voltage being converted to a pulse train by an analog-to-pulse rate converter. Thus the output of the analog-to-pulse rate converter is a series of output pulse signals having a variable signal repetition rate $f$ proportional to the average power with each pulse signal representing a constant or quantized amount of electrical energy. A counter or register performs conventional accumulation storage and display functions in response to the series of output pulses delivered thereto from the analog to pulse rate converter.

3 Claims, 1 Drawing Figure

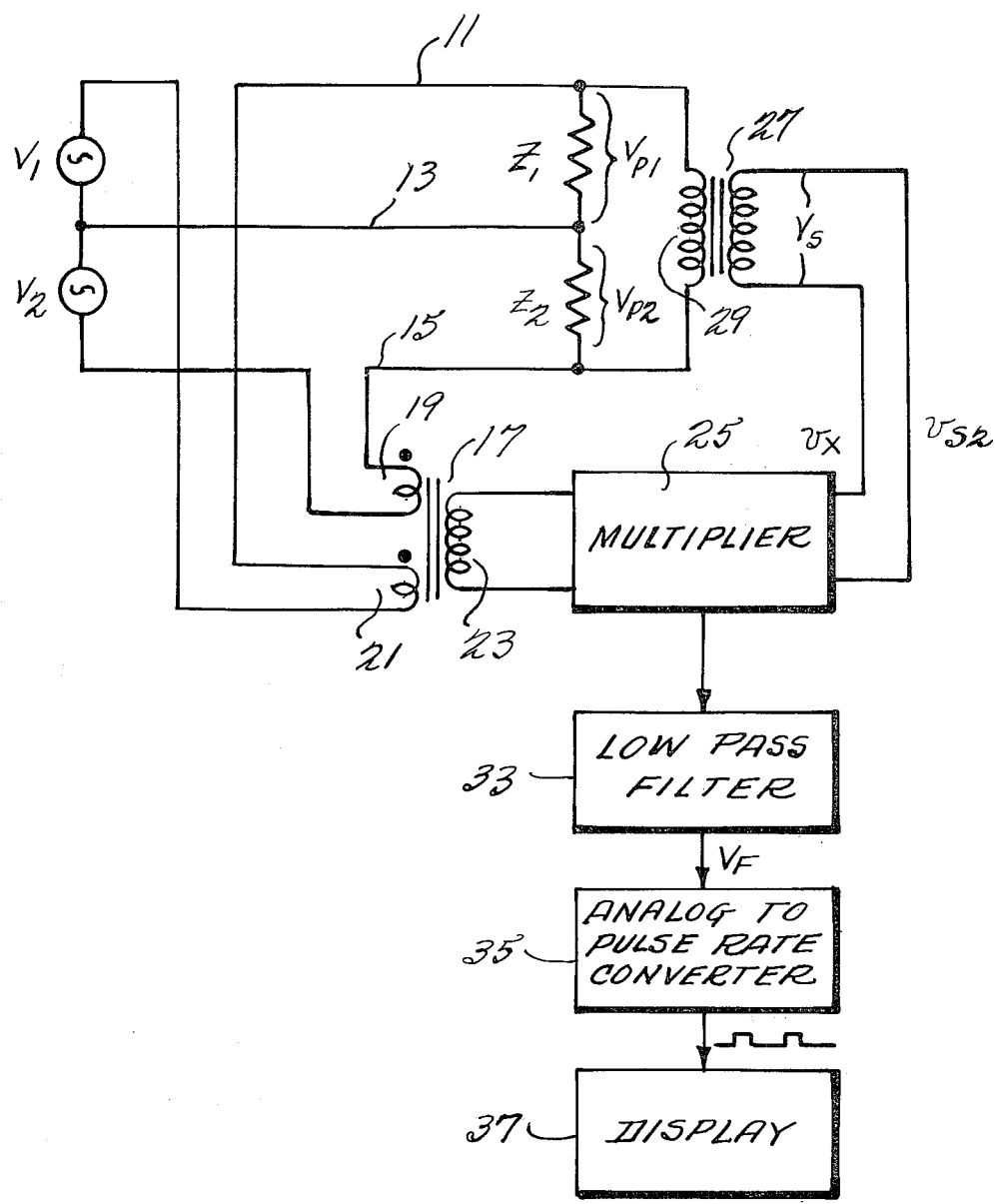

SINGLE PHASE 3-WIRE ELECTRONIC ELECTRICAL ENERGY METER

CROSS REFERENCES TO RELATED PATENT APPLICATIONS

A related copending U.S. patent application, Ser. No. 395,142, filed Sept. 7, 1973, now U.S. Pat. No. 3,875,508, in behalf of the inventor-applicant, Miran Milkovic, titled "Metering Electrical Energy (kWh) in Single Phase Systems" discloses and claims a method and apparatus for metering kWh in single phase systems. This reference discloses circuitry including an analog to pulse rate converter and multiplier together with a low pass filter which may be advantageously employed in the invention hereinafter disclosed. Another related copending U.S. patent application, Ser. No. 361,030, now U.S. Pat. No. 3,875,509, filed MaY 17, 1973, in behalf of the inventor-applicant, Miran Milkovic, titled "Electronic Metering of Active Electrical Energy (kWh)", discloses and claims a method and apparatus of metering kWh in polyphase systems and more specifically discloses a multiplier, low pass filter and analog-to-pulse rate converter which could be utilized advantageously in the invention hereinafter disclosed. Finally, a related copending U.S. patent application, Ser. No. 467,889, filed May 8, 1974 in behalf of the inventor-applicant, Miran Milkovic, entitled "Analog to Pulse Rate Converter" discloses and claims various embodiments of an analog to pulse rate converter which may be employed to advantage in the invention hereinafter disclosed. The aforesaid Miran Milkovic is the same inventor-applicant in whose behalf this application is being filed.

The entire right, title and interest in and to the inventions described in the aforesaid patent applications, as well as in and to the aforementioned patent applications, and the entire right, title and interest in and to the invention hereinafter disclosed, as well as in and to the patent application of which this specification is a part, are assigned to the same assignee.

BACKGROUND OF THE INVENTION

This invention relates to metering electrical energy in terms of, for example, kilowatt hours in electrical systems and more specifically, to a method and apparatus for metering electrical energy in a single phase, a.c. electrical system having three lines or wires.

Electrical energy in terms of kilowatt hours or kWh has been and continues to be metered with the rotating disc type of meter which is disclosed in, among other sources, the "Electrical Meterman's Handbook", Chapter 7, 7th Edition, published 1965 by Edison Electric Institute. The invention hereinafter disclosed represents a departure from the methodology and apparatus exemplified by the rotating disc-type meter.

In addition, those who are familiar with the instrumentation and metering arts respecting electrical power and energy know of proposed systems, including apparatus employing electronic and solid state devices for measuring power and energy. In such apparatus, the electronic and solid state devices replace the conventional rotating disc. However, these apparatus are primarily directed to polyphase systems or single phase, two-wire systems as opposed to the three-wire system to which the subject invention is applicable.

Thus, in prior art systems, the current flowing through a line and the voltage across a load impedance connected to the line are each detected and signals representing these parameters are coupled to a pulse width amplitude multiplier. The multiplier generates an output signal which is proportional to the product of the detected current and voltage. This signal is then averaged by means of a low pass filter to provide a d.c. voltage having an amplitude which is proportional to the total average power of the electrical system. This d.c. voltage is converted to a pulse train by an analog-to-pulse rate converter, which pulse train has a variable signal repetition rate $f$ which is proportional to the average power in the system, with each output pulse signal representing a constant quantized amount of electrical energy. The output pulse train is then coupled to a display mechanism which may, for example, include a counter or register which performs conventional accumulation storage and display functions. However, none of the prior art measuring systems is designed to measure the power consumed in a single phase, three-wire system wherein a conventional pulse width amplitude multiplier having a single voltage and current derived input is utilized. Accordingly, a multiplier of alternate design is required in order to accommodate the detected input levels on the lines of the three-wire system.

Accordingly, it is an object of this invention to provide a method and apparatus for metering kWh in a single phase, three-wire a.c. electrical system.

It is another object of this invention to provide a method and apparatus for metering active electrical energy in a single phase, three-wire electrical system wherein a multiplier of conventional design, suitable for use in a single phase, two-wire system, may be utilized.

It is another object of this invention to provide a meter for metering active electrical energy wherein the meter includes solid state circuits which may be fabricated in the form of monolithic integrated structures.

SHORT STATEMENT OF THE INVENTION

Accordingly, this invention relates to a method and apparatus for measuring the active electrical energy in a single phase, three-wire a.c. electrical system. The apparatus includes a current transformer having two primary windings, one each, connected in series with an associated line in the electrical system. The secondary of the current transformer is connected to a pulse width amplitude multiplier. A potential transformer has its primary windings connected across the load impedances of the system with the secondary windings thereof connected to the multiplier. The output of the multiplier is connected to a low pass filter, which in turn is connected to an analog-to-pulse rate converter for converting the product signal to a pulse train having a frequency which is proportional to the average power of the system. The output of the analog to pulse rate converter is connected to an output display.

Although the invention is hereinafter disclosed as being applicable for metering kWh in a single phase 60 Hz. electrical system having three lines of wires, it is to be understood that the disclosure is made for the purpose of giving examples of the method and metering apparatus provided by the invention. The invention may be employed as well for metering active electrical energy in single phase electrical systems having electrical loads which may include reactive impedances and system frequencies which may be 60 Hz. as well as less than or more than 60 Hz. Furthermore, in accordance with the invention, kWh metering may be performed as a real-time operation or may be performed as an off-line operation. In addition, it should be understood that in accordance with the invention, the system may include more than three electrical lines or wires.

BRIEF DESCRIPTION OF THE DRAWING

Other objects, features and advantages of the invention will be more fully apparent from the following detailed description, appended claims and the accompanying drawing which is a schematic illustration of the active electrical energy meter of the present invention.

DETAILED DESCRIPTION OF THE PREFERRED EMBODIMENT

Referring to the FIGURE, there is disclosed a three-wire, single phase, a.c. electrical system having a first and second source of electrical energy $V_1$ and $V_2$, respectively. Connected across the energy source $V_1$ is a load impedance $Z_1$ with the load impedance being connected to the source of energy by means of a first conductor 11 and a second common return conductor 13. A second load impedance $Z_2$ is connected across the second source of energy $V_2$ by means of a third conductor 15 and the common conductor 13.

A current transformer 17 having two primary windings 19 and 21 and a single secondary winding 23 is utilized to detect the level of current flow in the load impedances $Z_1$ and $Z_2$. Thus, primary winding 19 is connected in circuit with the conductor 15 as illustrated in the FIGURE and primary winding 21 is connected in circuit with the conductor 11, also as illustrated in the FIGURE. The secondary of the current transformer 17 is connected to a pulse width amplitude type multiplier 25. A potential transformer 27 has a primary winding 29 which is connected across both of the load impedances $Z_1$ and $Z_2$, as illustrated. The secondary of the potential transformer 27 is connected directly to the multiplier 25. The total primary voltage $V_{p1}$ and $V_{p2}$ is transformed into the secondary voltage $V_s$ such that the value of the voltage $V_s$ is proportional to one-half of the sum of the voltages $V_{p1}$ and $V_{p2}$. Thus the voltage $V_s$ is proportional to one-half the total voltage across the load impedances multiplied by the appropriate transformer ratio. Thus, the multiplier has only one current input and one voltage input despite the fact that the electrical energy in a three-wire system is being measured.

As is known, the output of the multiplier 25, which is of conventional design known in the art, is in the form of a pulse width amplitude modulated signal wherein the output voltage is given by the relationship $$V_z = k_1 i_s \times V_{s2} \qquad (1)$$

where $$V_{s2} = k_2 \frac{V_{p1} + V_{p2}}{2} \qquad (2)$$

$k_1$ and $k_2$ are dimensional constants. This output signal is then averaged and converted to a d.c. voltage in a low pass filter which may be a conventional passive or active filter. The output of the low pass filter 33 is a d.c. signal $V_F$ which has an amplitude which is proportional to the total average power in the load impedances $Z_1$ and $Z_2$. Accordingly, the voltage $V_F$ at the output of the low pass filter 33 is given by the following relationship:

$$V_F = k_3(V_{p1}I_{p1}\cos\theta_1) + k_4(V_{p2}I_{p2}\cos\theta_2) \qquad (3)$$

where $k_3$ and $k_4$ are dimensional constants, $V$ and $I$ are rms voltages and currents, respectively, and $\theta_1$ and $\theta_2$ are load impedance phase angles of the impedances $Z_1$ and $Z_2$. This d.c. signal is then coupled to the analog-to-pulse rate converter 35 which converts the d.c. signal into a pulse train having a repetition rate which is proportional to the average power being consumed in the electrical system. Each output pulse represents a constant or quantized quantity of energy representing a predetermined number of watt hours per pulse. The pulse train is coupled to an output display section which may preferably include a register or a counter for performing conventional accumulation storage and display functions in response to the received series of output pulses from the analog-to-pulse rate converter. Thus, the output display section 37 in effect integrates the output of the analog-to-pulse rate converter to thereby derive an output which corresponds to the electrical energy of the single phase, three-wire system.

By applicant's invention a conventional pulse width amplitude multiplier having a single system voltage related input and a single system current related input can be utilized despite the fact that the energy in a three-wire system is being measured. Accordingly, by the present invention, the requirement that the multiplier be modified to accept two or more current related inputs is obviated, thereby making it possible to measure a three-wire, single phase, electrical system with conventional solid state meters.

The present invention has been disclosed in connection with a preferred embodiment thereof. It should be understood that there may be other embodiments of the present invention which fall within the spirit and scope thereof as defined by the appended claims.

What is claimed is:

1. An apparatus for measuring the electrical energy in a single phase, three-wire, a.c. system comprising:
    a current transformer having two primary windings and a single secondary winding, one of said primary windings being connected in series with one of said wires and the other of said primary windings being connected in series with a second one of said wires,
    a potential transformer having a primary and a secondary winding, the primary winding of said potential transformer being connected across the load impedances of said three-wire electrical system,
    pulse width amplitude multiplying means connected to the secondary of said current transformer and the secondary of said potential transformer for generating a signal which is proportional to the total power in said electrical system,
    means for converting said power proportional signal to a pulse train having a pulse repetition rate which is proportional to the total average power in said system, each pulse corresponding to a constant amount of electrical energy, and
    means for accumulating said electrical pulses.

2. The apparatus of claim 1 further comprising means receiving the output of said multiplier for deriving a d.c. voltage having an amplitude which is proportional to the total average power in said electrical system.

3. A method of measuring the electrical energy in a single phase, three-wire, a.c. system comprising the steps of:

measuring the current flow in a first line of said system;

measuring the current flow in a second line of said system;

deriving a signal which is proportional to the sum of said current flow in said first and second lines;

measuring the voltage across the load impedances of said system;

deriving a signal which is proportional to said measured voltage;

deriving a signal which is proportional to the product of said summed current signal and said derived voltage signal by pulse width modulating said signals;

converting said multiplied signal to a pulse train having a frequency proportional to the average power in said system; and means for accumulating said pulses of said pulse train thereby deriving the electrical energy of said system.

* * * * *